United States Patent [19]

Ogawa et al.

[11] Patent Number: 4,827,146
[45] Date of Patent: May 2, 1989

[54] PHOTOELECTRIC CONVERSION ELEMENT IMAGE SENSOR WITH COMBINED FIELD EFFECT TRANSISTOR HAVING COMPACT SIZE

[75] Inventors: Minoru Ogawa; Koichiro Sakamoto; Toshiyuki Tamura; Kazushige Katsuumi, all of Shizuoka, Japan

[73] Assignee: Tokyo Electric Co., Ltd., Tokyo, Japan

[21] Appl. No.: 75,822

[22] Filed: Jul. 20, 1987

[30] Foreign Application Priority Data

Jul. 24, 1986 [JP] Japan ................................. 61-174381

[51] Int. Cl.⁴ .............................................. H01J 40/14
[52] U.S. Cl. ......................................... 250/578; 357/30
[58] Field of Search ............................ 250/578, 211 J; 357/30 Q, 30 D

[56] References Cited

U.S. PATENT DOCUMENTS 4,405,857  9/1983  Hirai et al. ........................... 250/578
4,471,371  9/1984  Hamano ................................ 357/30
4,555,636  11/1985  Fujisawa et al. .................... 250/578
4,574,310  3/1986  Nishizawa et al. .................. 250/578

*Primary Examiner*—David C. Nelms
*Attorney, Agent, or Firm*—Oblon, Fisher, Spivak, McClelland & Maier

[57] ABSTRACT

A photoelectric conversion device is disclosed which comprises a large number of photoelectric conversion elements arranged in an array on a substrate and thin film transistors individually corresponding to the photoelectric conversion elements and arranged in an array in parallel with the direction of the array of the photoelectric conversion elements, in which two electrodes of each of the thin film transistors are arranged to oppose each other in the direction of the array of the photoelectric conversion elements so that the width of the channel formed between both the electrodes may be prolonged, and thereby, switching operation by the thin film transistor is made reliable and the manufacture of the thin film transistor portion is facilitated.

6 Claims, 3 Drawing Sheets

PHOTOELECTRIC CONVERSION ELEMENT IMAGE SENSOR WITH COMBINED FIELD EFFECT TRANSISTOR HAVING COMPACT SIZE

FIELD OF THE INVENTION AND RELATED ART STATEMENT

The present invention relates to an image sensor for use in an image reading apparatus or the like and more particularly to such devices of the structure wherein photoelectric conversion elements and thin film transistors for switching the elements individually are formed on the same substrate.

Recently, in the field of image reading apparatus, an actual-size photosensor made up of an array of thin film photoelectric conversion elements and elongated to the width of an original has been proposed as an image sensor for reading image information on an original or the like without using a scale-down optical system and some of such sensors are already put into practice.

As representative ones of such photoelectric conversion devices, there are those of a sandwich type of the structure in which a photoconductive member made of amorphous silicon (a-Si) is sandwiched between a transparent electrode and a metallic electrode and those of a planer type of the structure in which an array of counter electrodes are disposed flat against an insulating substrate and a film of photoconductive material of amorphous silicon or the like is formed over or under the counter electrodes.

In either type, at least one element is required for each of the photoelectric conversion element for switching a large number of such photoelectric conversion elements formed of those photoconductive members and electrodes. And, thin film transistors (TFT) or IC have so far been in use for such elements.

An example of conventional image sensors of the planer type is shown in FIGS. 4 and 5. FIG. 4 sectionally shows construction of one bit portion of the device, in which a photoconductive film 2 of a-Si:H is formed in a predetermined pattern on an insulating substrate 1 of glass or the like. On the photoconductive film 2, there are disposed flatly opposing thereto counter electrodes, i.e., a common electrode 3 and individual electrode 4. Between the photoconductive film 2 and the electrodes 3, 4, an n+a-Si:H film 5 is interposed to provide ohmic contact therebetween. Thus, a photoelectric conversion element 6 is provided. Also, a thin film transistor 7 (Field Effect Transistor) is disposed on the substrate 1 for switching such photoelectric conversion element 6. The thin film transistor 7 is constructed first by forming a gate electrode 8 on the substrate 1, and forming thereon a photoconductive film 10 of a-Si:H by patterning at the same time as the photoconductive film 2 is formed, with an insulating film 9 interposed therebetween, and, in the topmost layer, forming a source electrode 11 and a drain electrode 12 so as to oppose each other across a channel 13. In such thin film transistor 7, also, an n+a-Si:H film 14 is interposed between the photoconductive film 10 and the electrodes 11, 12. The individual electrode 4 of the photoelectric conversion element 6 and the source electrode 11 of the thin film transistor 7 are structured so as to be electrically connected.

In the view from the top, as shown in FIG. 5, numbers of such photoelectric conversion elements 6 and thin film transistors 7, each thereof forming the one-bit structure as described above, are each arranged in an array on the substrate 1 in its longitudinal direction. Only extracting the electrodes 3, 4, 11, 12, their patterns are exemplified in FIG. 5. The portion labeled A indicates the photoelectric conversion element portion and the portion labeled B indicates the thin film transistor portion.

Problems encountered in such prior art device will be described below. As a measure for improving resolving power in reading of the device, it is generally practiced to narrow the distance between the photoelectric conversion elements 6 in the direction of their array. Then, the thin film transistor 7 in one-to-one correspondence to the photoelectric conversion element 6 must also be closely arranged. However, when the thin film transistors 7 are packed in the direction of the array, since the photoelectric conversion elements 6 and the thin film transistors 7 are huge in number in an actual device, it becomes possible that difficulties are easily produced from the spatial restriction if the simple arrangement of them in a straight line as shown in FIG. 5 is adhered to. The channel width $W_1$ of the channel 13 of the thin film transistor 7, in particular, is subject to the restriction by the increase in the density in the direction of the array (the resolving power) of the photoelectric conversion elements 6 and the width is thereby narrowed. The decrease in the channel width $W_1$ causes reduction in the current value at the time of switching of the photoelectric conversion element 6 and it in turn may lead to its incapability of correct detection in the reading. Also, separation between the thin film transistors 7 may easily become incomplete and their pattern etching proceeding may become difficult.

OBJECT AND SUMMARY OF THE INVENTION

A first object of the present invention is to provide an image sensor, in those of the structure in which the photoelectric conversion elements are disposed in high density, adapted such that correct operation of the thin film transistor is assured and no switching error is produced.

A second object of the present invention is to provide an image sensor, in those of the structure in which the photoelectric conversion elements are disposed in high density, the thin film transistor portion thereof will be manufactured easily and accurately.

To achieve the above mentioned objects, the present invention is adapted such that a large number of photoelectric conversion elements are arranged in an array on a substrate, thin film transistors individually corresponding to the photoelectric conversion elements are arranged in an array in parallel with the direction of the array of the photoelectric conversion elements, and two electrodes of the thin film transistor are arranged to oppose each other in the direction of the array of the photoelectric conversion elements. And thereby, it has been made possible to freely set up the channel width of the thin film transistor not subject to restriction by the density of the photoelectric conversion elements. Thus, by making larger the channel width of the thin film transistor, it becomes possible to have a larger current value provided at the time of the switching whereby correct detection in the reading is enabled to be performed free from switching error. The pattern etching process of the thin film transistor is also made easier.

DESCRIPTION OF THE PREFERRED EMBODIMENTS

Figure 1:
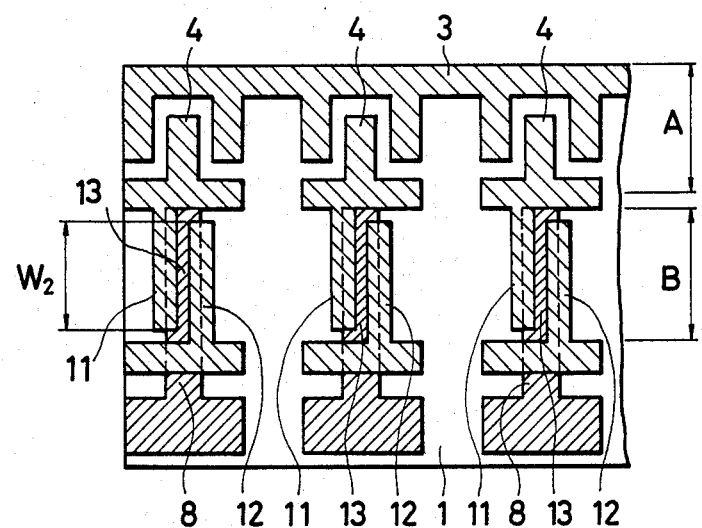
FIG. 1 is a plan view of electrode patterns showing a first embodiment of the present invention.
Figure 2:
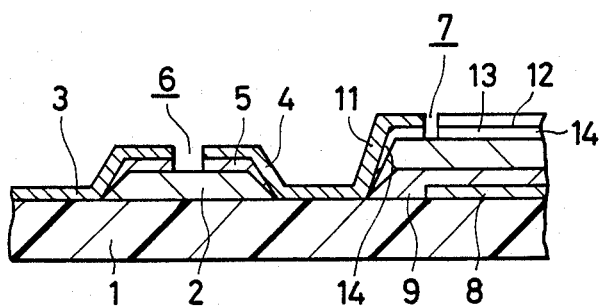
FIG. 2 is a side view in vertical section of the same.
Figure 4:
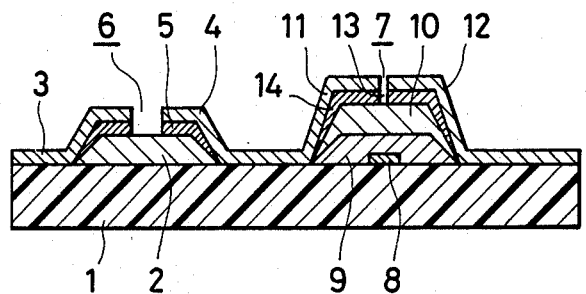
FIG. 4 is a side view in vertical section showing an example of prior art devices.
Figure 5:
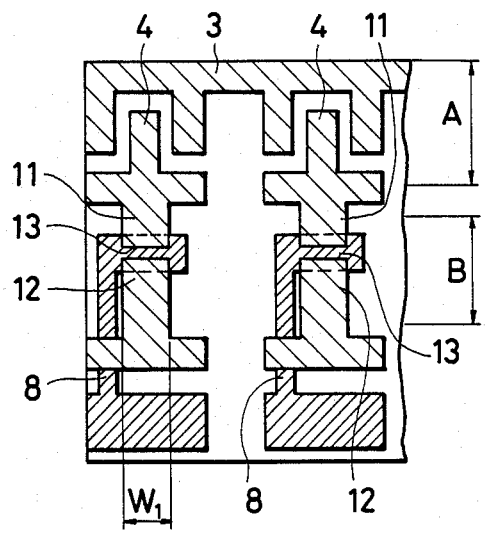
FIG. 5 is a plan view of electrode patterns showing the example of prior art devices.

A first embodiment of the present invention will be described below with reference to FIGS. 1 and 2. The present embodiment is such that is applied to the device of the planer type, and in the drawings, like parts to those shown in FIGS. 4 and 5 are denoted by like reference numerals and description thereof are omitted (the same will hereinafter be applicable). FIG. 1, the same as FIG. 5, shows only extracted electrodes 3, 4, 11, 12. In the present embodiment, the source electrode 11 and the drain electrode 12 are changed to have such patterns as to oppose each other in the direction of the array of the photoelectric conversion element 6 (in the horizontal direction in FIG. 1). That is, the channel 13 formed between the source electrode 11 and the drain electrode 12 is arranged to be running in the direction perpendicular to the direction of the array of the photoelectric conversion elements 6 (in the vertical direction in FIG. 1). The pattern of the gate electrode 8 is appropriately changed according to the changes in the patterns of the source electrode 11 and the drain electrode 12. That is, it is formed so as to be situated under the channel 13.

With such arrangement, the channel width $W_2$ is secured in the direction perpendicular to the direction of the array, so that a large channel width $W_2$ can be provided unrestricted by the density of the photoelectric conversion element 6. That is, the degree of freedom of the channel width $W_2$ can be increased. And thereby, the value of the current at the time of the switching of the photoelectric conversion element 6 by the corresponding thin film transistor 7 can be increased and reliable reading of image information free from switching error can be executed. By virtue of such arrangement of the channel 13 perpendicular to the direction of the array, there is left sufficient space between the bits, and therefore, the etching in the patterning of the source electrode 11 and the drain electrode 12 is facilitated and the separation between the thin film transistors 7 is made easy.

Although the embodiment described above has been that applied to the planer type, the embodiment can likewise be applied to the sandwich type. And, to the thin film transistor 7, not only the FET of the voltage control type as used in the above embodiment is applicable but also that of the current control type may be applied.

Figure 3:
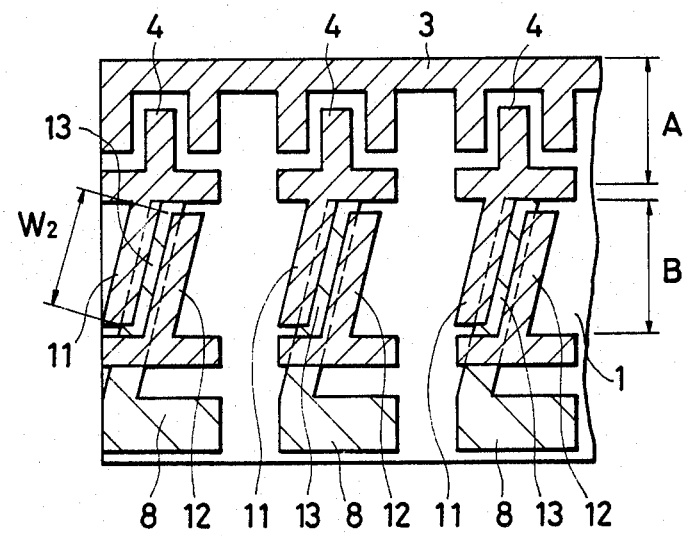
FIG. 3 is a plan view of electrode patterns showing a second embodiment of the present invention.

Now, a second embodiment of the present invention will be described with reference to FIG. 3. In this embodiment, the source electrode 11 and the drain electrode 12 of the thin film transistor 7 are patterned so that the channel 13 is somewhat inclined from the direction perpendicular to the direction of the array of the photoelectric conversion elements 6. At the same time, the gate electrode 8 is formed under the channel 13 according to such pattern form. Therefore, the size of the substrate 1 in the direction perpendicular to the direction of the array of the photoelectric conversion elements 6 can be reduced with the channel width $W_2$ maintained at a certain size. By such arrangement, it is enabled to make the device advantageous when many structural members are to be mounted on the substrate 1 or it is specifically required to make the substrate 1 small in size.

What is claimed is:

1. An image sensor comprising:
   an insulating substrate;
   a plurality of photoelectric conversion elements arranged in planar array on said substrate; and
   thin film transistors individually corresponding to said photoelectric conversion elements and arranged in planar array in a direction which is parallel to the direction of the array of said photoelectric conversion elements, with each said transistor having two electrodes opposing each other in the direction of the array of said photoelectric conversion elements.

2. An image sensor according to claim 1, wherein the two opposing electrodes of said thin film transistor are formed so that a channel formed therebetween is arranged in the direction perpendicular to the array of said photoelectric conversion elements.

3. An image sensor according to claim 2, wherein said thin film transistor is made up of a field effect transistor.

4. An image sensor according to claim 1, wherein the two opposing electrodes of said thin film transistor are formed so that a channel formed therebetween is inclined from the direction perpendicular to the array of said photoelectric conversion elements.

5. An image sensor comprising:
   an insulating substrate;
   a plurality of photoelectric conversion elements each having an individual electrode wherein said elements are arranged on said substrate in an array;
   a plurality of source electrodes in a one-to-one relationship conversion element with each attached to respective individual electrode and having a rectangular shape;
   a plurality of drain electrodes in a one-to-one relationship to said source electrodes having a portion substantially rectangular in shape, said portion being placed in such a manner on said substrate so as to form a channel in a direction perpendicular to the array of said photoelectric conversion elements; and
   a plurality of gate electrodes in a one-to-one relationship to said drain electrodes wherein each gate electrode is T-shaped wherein the portion of the gate electrode which bisected by the other portion is placed at the position furthest from said photoelectric conversion element.

6. An image sensor comprising:
   an insulating substrate;
   a plurality of photoelectric conversion elements each having an individual electrode wherein said elements are arranged on said substrate in an array;
   a plurality of source electrodes in a one-to-one relationship with said conversion elements with each source electrode attached to a respective individual electrode and having a portion rectangular in shape;
   a plurality of drain electrodes in a one-to-one relationship to said source electrodes having a portion substantially rectangular in shape, said portion being placed in such a manner on said substrate so as to form a channel in a direction which is inclined from the perpendicular direction to the array of said photoelectric conversion elements; and a plurality of gate electrodes in a one-to-one relationship to said drain electrodes wherein each gate electrode is formed as a polygon having one section formed underneath the channel formed by said source and drain electrodes and having another portion which is placed parallel to and at the farthest position of said gate electrode from the respective photoelectric conversion element.

* * * * *